United States Patent
Lee

(10) Patent No.: US 8,804,336 B2
(45) Date of Patent: Aug. 12, 2014

(54) HEAT DISSPATING APPARATUS AND ELECTRONIC DEVICE

(75) Inventor: Chih-Peng Lee, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 292 days.

(21) Appl. No.: 13/217,300

(22) Filed: Aug. 25, 2011

(65) Prior Publication Data

US 2012/0293958 A1     Nov. 22, 2012

(30) Foreign Application Priority Data

May 16, 2011    (TW) ............................. 100116990 A

(51) Int. Cl.
| | |
|---|---|
| H05K 7/20 | (2006.01) |
| F28D 15/04 | (2006.01) |
| H01L 23/427 | (2006.01) |
| F28D 15/02 | (2006.01) |
| H01L 23/467 | (2006.01) |

(52) U.S. Cl.
CPC ............. *H01L 23/427* (2013.01); *H01L 23/467* (2013.01); *F28D 15/0275* (2013.01); *F28D 15/0233* (2013.01); *F28D 15/0266* (2013.01); *H05K 7/20336* (2013.01); *H05K 7/2029* (2013.01)
USPC ...... 361/700; 361/717; 361/718; 361/679.47; 361/679.52

(58) Field of Classification Search
CPC . H01L 23/427; H01L 23/467; F28D 15/0275; F28D 15/0266; F28D 15/0233; H05K 7/20336; H05K 7/2029
USPC ........ 361/700, 679.52, 696, 679.47, 717, 718
See application file for complete search history.

(56) References Cited

U.S. PATENT DOCUMENTS

| | | | | |
|---|---|---|---|---|
| 7,542,293 | B2 * | 6/2009 | Zhao et al. ..................... | 361/700 |
| 7,779,894 | B2 * | 8/2010 | Peng et al. .................... | 165/80.3 |
| 8,149,580 | B2 * | 4/2012 | Yu et al. ........................ | 361/710 |
| 8,493,737 | B2 * | 7/2013 | Abe et al. ...................... | 361/700 |
| 2004/0001316 | A1 * | 1/2004 | Kamikawa et al. ........... | 361/700 |
| 2004/0042184 | A1 * | 3/2004 | Tomioka ....................... | 361/752 |
| 2007/0097644 | A1 * | 5/2007 | Lu et al. ........................ | 361/700 |
| 2007/0251676 | A1 * | 11/2007 | Cheng et al. ............. | 165/104.33 |
| 2007/0279866 | A1 * | 12/2007 | Cheng et al. .................. | 361/700 |
| 2008/0013285 | A1 * | 1/2008 | Hung ............................ | 361/719 |
| 2008/0023176 | A1 * | 1/2008 | Peng et al. .................... | 165/80.3 |
| 2008/0130240 | A1 * | 6/2008 | Wang et al. ................... | 361/719 |
| 2009/0195988 | A1 * | 8/2009 | Hongo ......................... | 361/709 |
| 2009/0229791 | A1 * | 9/2009 | Hung et al. .................. | 165/80.3 |
| 2010/0238631 | A1 * | 9/2010 | Kuo et al. ..................... | 361/704 |
| 2010/0254083 | A1 * | 10/2010 | Yang ............................. | 361/695 |
| 2010/0258276 | A1 * | 10/2010 | Chen et al. ............... | 165/104.26 |

(Continued)

*Primary Examiner* — Anatoly Vortman
(74) *Attorney, Agent, or Firm* — Novak Druce Connolly Bove + Quigg LLP

(57) ABSTRACT

A heat dissipating apparatus includes a centrifugal fan, a heat sink and a heat pipe. The centrifugal fan includes a frame and an air outlet defined on the frame. The heat sink is arranged adjacent to the air outlet of the centrifugal fan. The heat pipe includes an evaporation section and a condensation section extending from the evaporation section. The condensation section is connected to the heat sink. The evaporation section is for absorbing heat from a first and second heat generating component. The frame includes an elastic plate abutting to the evaporation section of the heat pipe and applying a force to the evaporation section of the heat pipe. An electronic device equipped with the heat dissipating apparatus is also provided.

15 Claims, 5 Drawing Sheets

(56) References Cited

U.S. PATENT DOCUMENTS

| | | | |
|---|---|---|---|
| 2011/0103017 A1* | 5/2011 | Yu et al. | 361/697 |
| 2011/0149515 A1* | 6/2011 | Yang | 361/697 |
| 2011/0240258 A1* | 10/2011 | Yang et al. | 165/67 |
| 2012/0099278 A1* | 4/2012 | Chen et al. | 361/697 |

\* cited by examiner

HEAT DISSPATING APPARATUS AND ELECTRONIC DEVICE

BACKGROUND

1. Technical Field

The present disclosure generally relates to heat dissipating apparatus and electronic devices using the heat dissipating apparatus.

2. Description of Related Art

During operation of electronic devices such as computer central processing units (CPUs), north bridges and south bridges, a large amount of heat is often produced. The heat must be quickly removed from the electronic devices to prevent them from over heating and being damaged. Typically, a heat dissipation apparatus is attached to an outer surface of the electronic device to absorb the heat from the CPU.

A plurality of through holes are drilled in the circuit board to receive the fasteners for fixing the heat dissipation apparatus where the CPU sits. However, when synchronously cooling multiple electronic devices, more through holes are needed to receive additional fasteners for fixing a solid base of the heat dissipation apparatus, thereby occupying a lot of space on the circuit board and increasing wiring complexity thereof.

Therefore, what is needed is to provide a heat dissipating apparatus to overcome above shortcomings.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the disclosure.

DETAILED DESCRIPTION

Figure 1:
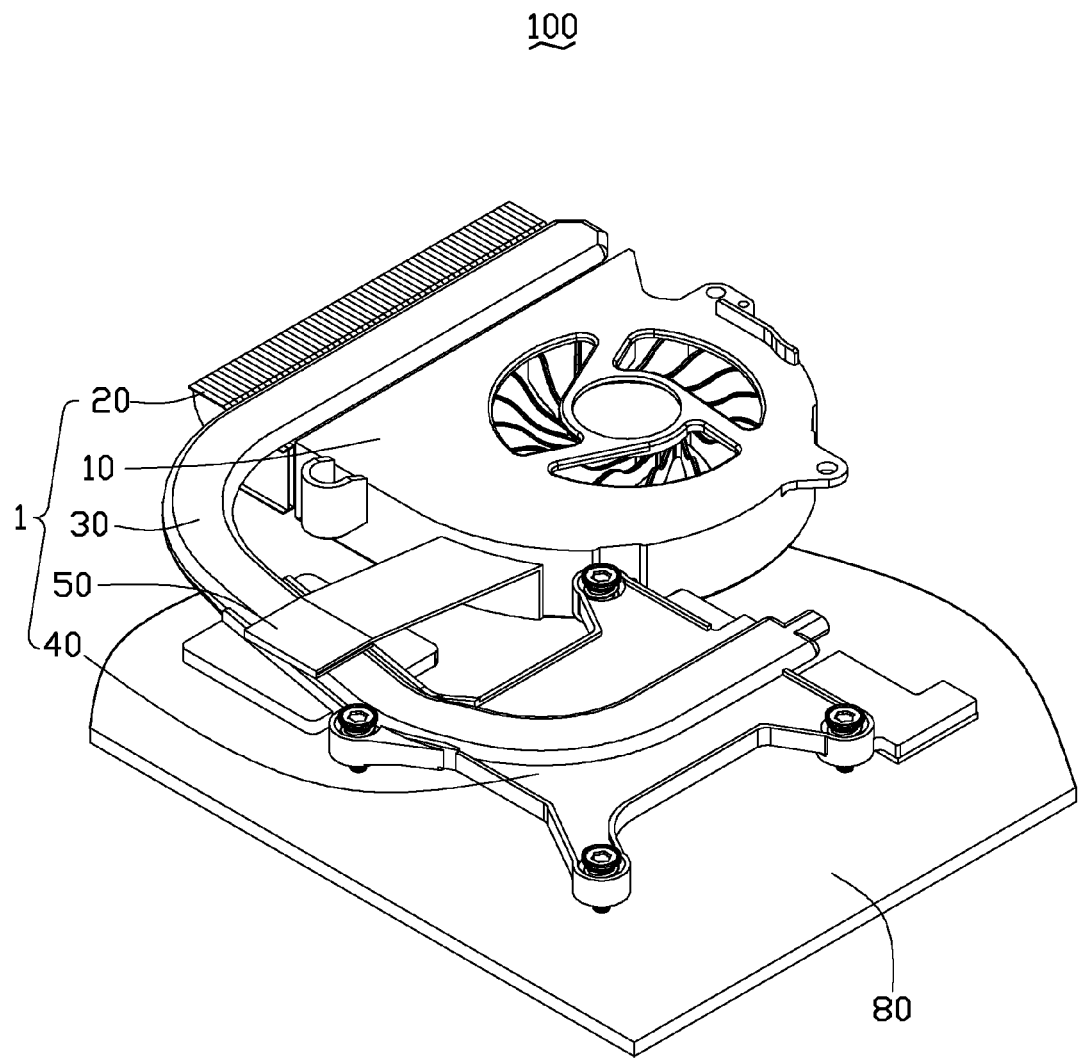
FIG. 1 is a schematic view of an electronic device using a heat dissipating apparatus in accordance with a first embodiment of the present disclosure.

Reference will now be made to the drawing to describe the present heat dissipating apparatus and electronic device using the same, in detail.

Figure 2:
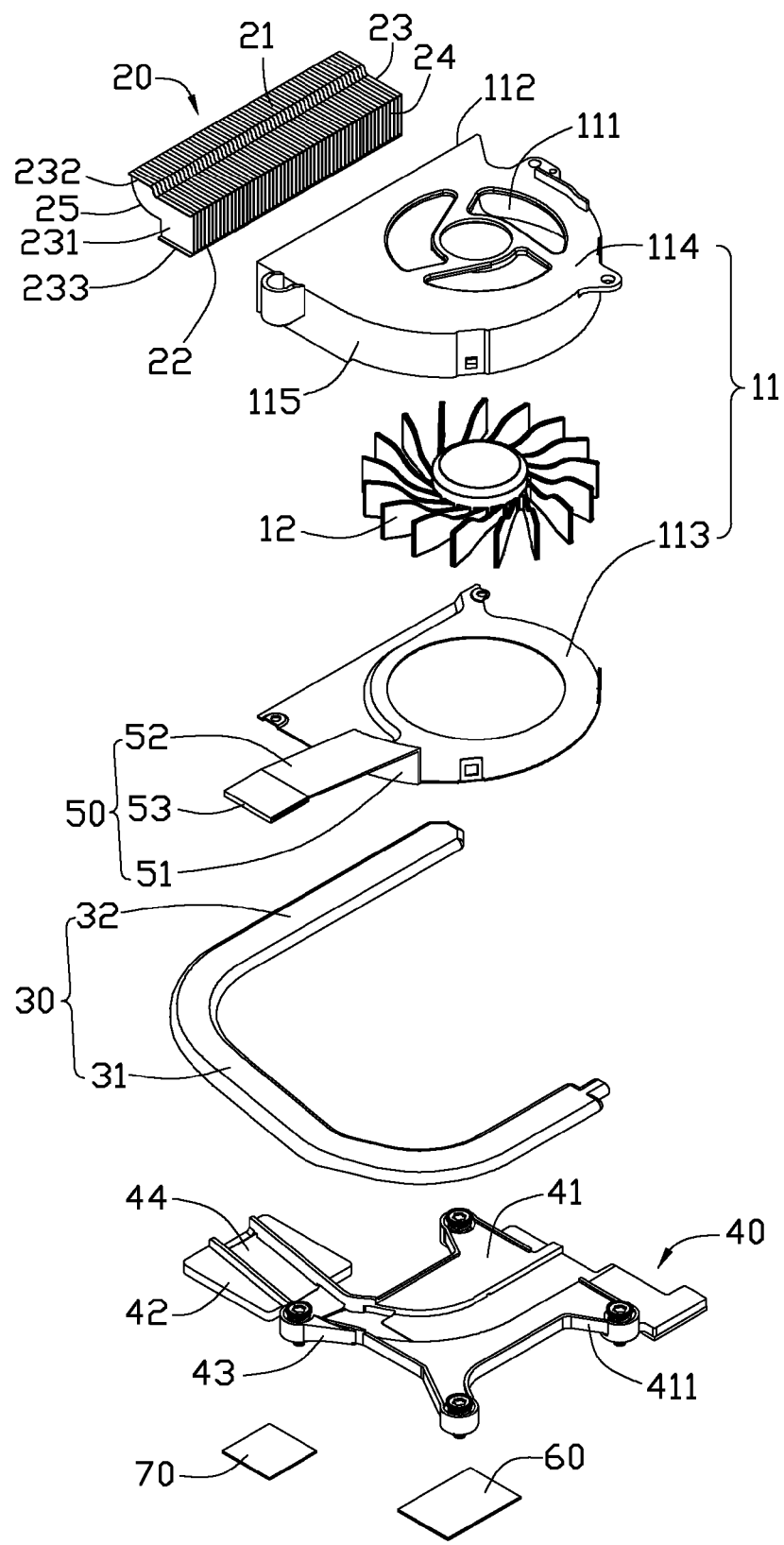
FIG. 2 is an exploded view of the electronic device of FIG. 1, with a circuit board omitted.

Referring to FIG. 1 and FIG. 2, an electronic device 100 according to a first embodiment includes a heat dissipating apparatus 1, a circuit board 80, a processor 60 and a chip 70. The processor 60 and the chip 70 are arranged on the circuit board 80. The heat dissipating apparatus 1 is for dissipating heat generated by the processor 60 and the chip 70.

The heat dissipating apparatus 1 includes a centrifugal fan 10, a heat sink 20 adjacent to the fan 10, a heat pipe 30 contacting the heat sink 20, a base 40 for contacting the processor 60 and the chip 70, and an elastic plate 50 applying a downward force to the heat pipe 30 to retain the heat pipe 30 with the base 40.

The centrifugal fan 10 includes a frame 11 and an impeller 12. The frame 11 is a hollow shell with a general D-shape. The frame 11 includes a bottom plate 113 and a cover 114. At a central portion of the frame 11, an air inlet 111 penetrating through the cover 114 and bottom plate 113 of the frame 11 is defined. An air outlet 112 is defined at a lateral side of the frame 11. The cover 114 has a box-like configuration, and includes a sidewall 115, which defines a downward opening facing to the bottom plate 113. The bottom plate 113 contacts the sidewall 115 and covers the opening defined by the sidewall 115.

The heat sink 20 is arranged adjacent to the air outlet 112. The heat sink 20 includes a plurality of fins 23 engaged together. Each fin 23 includes a top edge portion 232 and a bottom edge portion 233. The top edge portions 232 and bottom edge portions 233 of the plurality of fins 23 are bent at right angles along a same direction. The top edge portions 232 of the plurality of fins 23 cooperatively define a step-shaped top plate 21. The top plate 21 includes two steps with a height difference generally equal to a thickness of the heat pipe 30. The bottom edge portions 233 of the plurality of fins 23 cooperatively define a bottom plate 22. The heat sink 20 defines an airflow receiving surface 24 facing toward the air outlet 112 of the centrifugal fan 10, and an airflow releasing surface 25 away from the air outlet 112. The airflow receiving surface 24 has a height lower than the air outlet 112. An upper portion of the airflow releasing surface 25 bulges outward to form an arc-shaped surface. A lower portion of the airflow releasing surface 25 has a flat shape with a height lower than the air outlet 112. A vent is defined between each two neighboring fins 23.

In another alteration embodiment, the heat sink 20 can be consisting of a top plate 21, a bottom plate 22, and a plurality of fins 23 soldered between the top plate 21 and bottom plate 22.

The heat pipe 30 has a general flat body with a U-shape profile. The heat pipe 30 includes a condensation section 32, and an L-shaped evaporation section 31 extending from the condensation section 32. The condensation section 32 is arranged on and thermally contacts a lower step of the top plate 21 adjacent to the air outlet 112. In this embodiment, the condensation section 32 can be fixed to the heat sink 20 by soldering.

The base 40 is arranged on the circuit board 80 in use. The base 40 includes a general quadrate first heat absorbing plate 41, a general quadrate second heat absorbing plate 42, and a link plate 43 connecting the first heat absorbing plate 41 with the second heat absorbing plate 42. The first and second heat absorbing plates 41, 42 are both made of material with high thermal conductivity, for example copper. An area of the first heat absorbing plate 41 is larger than that of the second heat absorbing plate 42. The first heat absorbing plate 41 is in contact with the processor 60 to absorb heat generated by the processor 60. The second heat absorbing plate 42 is in contact with the chip 70 to absorb heat generated by the chip 70. The first heat absorbing plate 41 includes four ears 411 radially extending from four corners thereof. Each ear 411 includes a through hole for a fastener inserted there through to fix the base 40 to the circuit board 80. The link plate 43 sits adjacent to one of the four ears 411. A receiving groove 44 for receiving the evaporation section 31 of the heat pipe 30 is defined on a top face of the base 40. The receiving groove 44 traverses the first heat absorbing plate 41, the link plate 43 and the second heat absorbing plate 42. In this embodiment, the evaporation section 31 of the heat pipe 30 is soldered or adhered to the base 40.

The elastic plate 50 extends from a peripheral side of the bottom plate 113 of the frame 11 of the fan 10. The elastic plate 50 includes a supporting arm 51 extending from a peripheral side of the bottom plate 113, and an elastic portion 52 extending from an upper end of the supporting arm 51.

The supporting arm 51 is a thin plate abutting against the sidewall 115 of the cover 114. The supporting arm 51 has a height lower than that of the sidewall 115. An included angle between the supporting arm 51 and the elastic portion 52 can be a sharp angle, a right angle or an obtuse angle. In this embodiment, an included angle between the supporting arm 51 and the elastic portion 52 is generally a right angle.

The elastic portion 52 includes a free end away from the supporting arm 51. The free end is bent slightly downward. Thereby the elastic portion 52 is capable of applying a downward force to objects abutting to a bottom of the elastic portion 52 at the free end. In this embodiment, a thickening plate 53 is adhered to a bottom of the elastic portion 52 at the free end, to enhance mechanical strength of the elastic portion 52.

In addition, the supporting arm 51 can be omitted while the elastic portion 52 directly extends from the sidewall 115 of the cover 114.

When assembled with the heat pipe 30, the elastic portion 52 has its free end pushed upward by the evaporation section 31 due to a lack of height. Accordingly, the elastic portion 52 applies a downward pressure to the evaporation section 31, thereby pressing the evaporation section 31 tightly to the second heat absorbing plate 42 above the chip 70. As such, the second plate 42 is firmly fixed to the chip 70 by the elastic plate 50 without any other fasteners.

Heat generated by the processor 60 and the chip 70 is respectively transferred to the evaporation section 31 by the first and second heat absorbing plates 41, 42, and finally to the heat sink 20 via the condensation section 32. The centrifugal fan 10 generates airflow to the heat sink 20, thereby cooling the heat sink 20.

Figure 3:
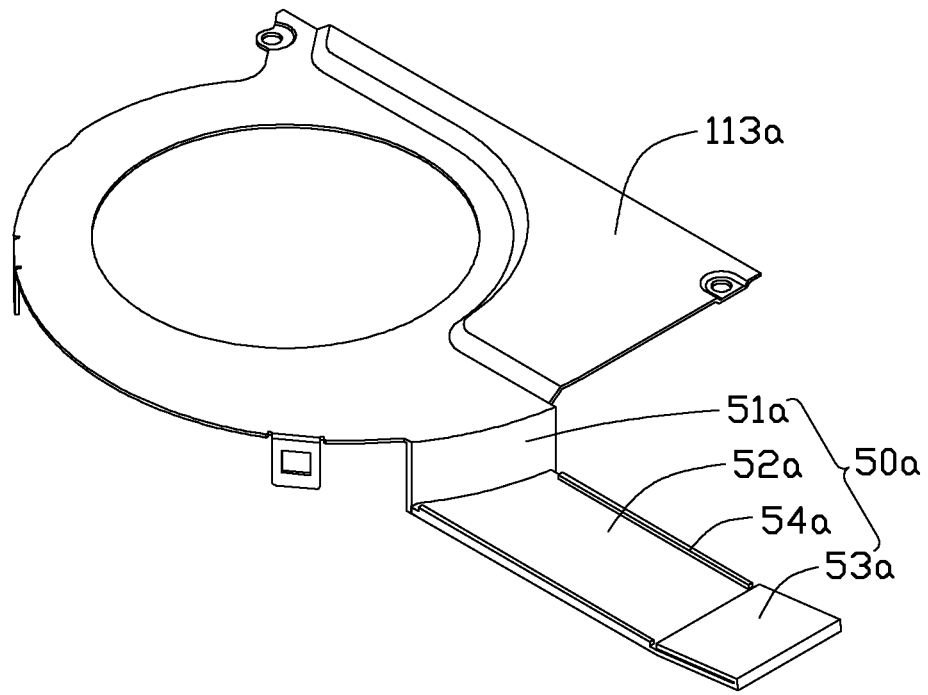
FIG. 3 is a schematic view of a bottom plate and elastic plate of a heat dissipating apparatus in accordance with a second embodiment of the present disclosure.

Referring to FIG. 3, a bottom plates 113a and an elastic plate 50a according to a second embodiment is provided, similar to the bottom plate 113 and the elastic plate 50 in the first embodiment. The elastic plate 50a includes a supporting arm 51a extending from a peripheral side of the bottom plate 113a, and an elastic portion 52a extending from an upper end of the supporting arm 51a. The elastic portion 52a includes a free end away from the supporting arm 51a, and a thickening plate 53a abutting a bottom of the elastic portion 52a at the free end.

The difference from the first embodiment is that, the elastic plate 50a in the second embodiment further includes two ribs 54a respectively extending from a lateral side of the elastic portion 52a, towards a plane where the bottom plate 113a sits. The two ribs 54a each have a height equal to a thickness of the thickening plate 53a. As such, a mechanical strength of the elastic portion 52a is further enhanced.

Figure 4:
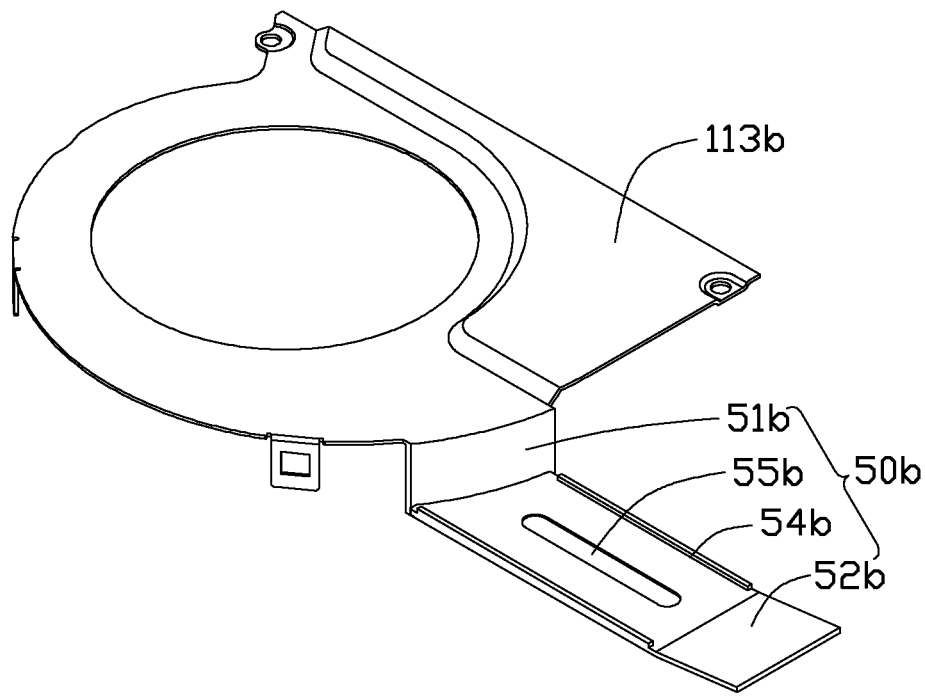
FIG. 4 is a schematic view of a bottom plate and elastic plate of a heat dissipating apparatus in accordance with a third embodiment of the present disclosure.

Referring to FIG. 4, a bottom plate 113b and an elastic plate 50b according to a third embodiment is provided, similar to the bottom plate 113a and the elastic plate 50a in the second embodiment. The elastic plate 50b includes a supporting arm 51b extending from a peripheral side of the bottom plate 113b, and an elastic portion 52b extending from an upper end of the supporting arm 51b. The elastic portion 52b includes two ribs 54b respectively extending from a lateral side of the elastic portion 52b, towards a plane where the bottom plate 113b sits. The difference is that, the elastic plate 50b is not equipped with any thickening plates, and a through slot 55b is defined in a central portion of the elastic plate 50b.

Figure 5:
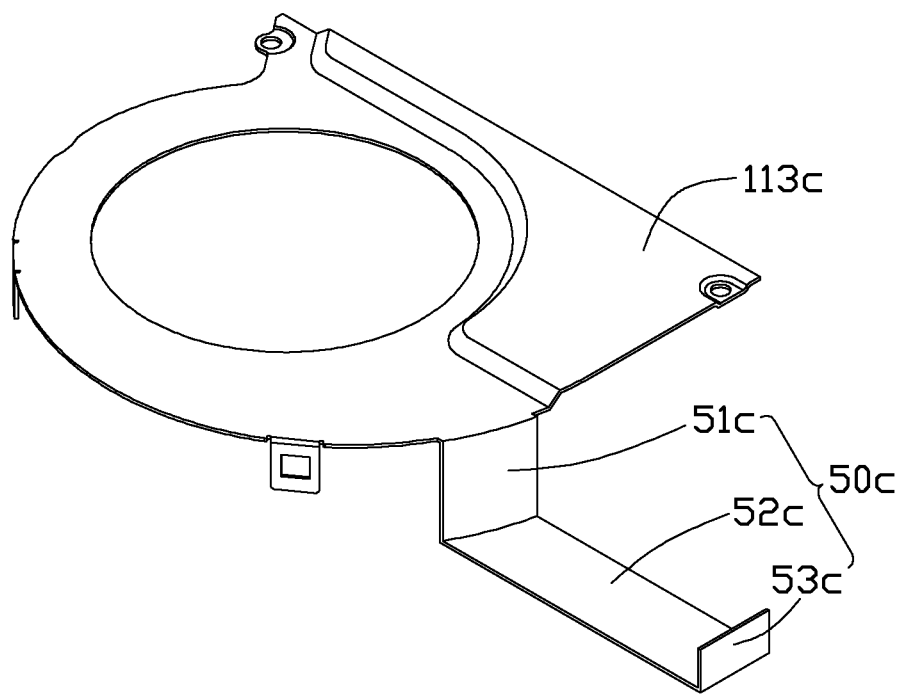
FIG. 5 is a schematic view of a bottom plate and elastic plate of a heat dissipating apparatus in accordance with a fourth embodiment of the present disclosure.

Referring to FIG. 5, a bottom plate 113c and an elastic plate 50c according to a fourth embodiment is provided, similar to the bottom plate 113 and the elastic plate 50 in the first embodiment. The elastic plate 50c includes a supporting arm 51c extending from a peripheral side of the bottom plate 113c, and an elastic portion 52c extending from an upper end of the supporting arm 51c. The difference is that, a thickening plate 53c extends from a free end of the elastic portion 52c, towards and perpendicular to a plane where the bottom plate 113c sits.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A heat dissipating apparatus comprising:
   a centrifugal fan comprising a frame defining an air outlet, and an elastic plate extending outwards from the frame;
   a heat sink adjacent to the air outlet of the centrifugal fan; and
   a heat pipe comprising an evaporation section for absorbing heat from a heat generating component and a condensation section connected to the heat sink, the elastic plate abutting the evaporation section of the heat pipe and applying a force on the evaporation section toward the heat generating component;
   wherein the frame comprises a cover with a sidewall and a bottom plate contacting the sidewall, the elastic plate being configured on the bottom plate; and
   wherein the elastic plate comprises a supporting arm and an elastic portion extending from the supporting arm, the supporting arm extending from a peripheral side of the bottom plate and abutting against the sidewall, the elastic portion extending from an upper end of the supporting arm.

2. The heat dissipating apparatus of claim 1, wherein the supporting arm has a height lower than that of the sidewall.

3. The heat dissipating apparatus of claim 2, wherein the elastic portion comprises two ribs, the two ribs each extending from a lateral side of the elastic portion.

4. The heat dissipating apparatus of claim 2, wherein the elastic portion comprises a plate extending towards a plane where the bottom plate sits.

5. The heat dissipating apparatus of claim 4, wherein the plate extends perpendicular to the plane where the bottom plate sits.

6. The heat dissipating apparatus of claim 2, wherein the elastic portion comprises a through slot defined at a central portion thereof.

7. The heat dissipating apparatus of claim 1, further comprising a base with a first heat absorbing plate, a second heat absorbing plate, and a link plate connected the first heat absorbing plate with the second heat absorbing plate, the first and second heat absorbing plates both contacting the evaporation section of the heat pipe, the first heat absorbing plate being for thermally contacting a first heat generating component, the second heat absorbing plate being for thermally contacting a second heat generating component.

8. An electronic device, comprising:
   a centrifugal fan with an air outlet;
   a heat sink adjacent to the air outlet of the centrifugal fan;
   a circuit board supporting a first heat generating component and a second heat generating component;
   a first plate contacting the first heat generating component;
   a second plate on the second heat generating component; and a heat pipe with a evaporation section and a condensation section extending from the evaporation section, the condensation section being connected to the heat sink, the evaporation section contacting the first plate and the second plate;

wherein the centrifugal fan further comprises a frame with an elastic plate, the elastic plate abutting against the evaporation section of the heat pipe, the elastic plate pressing the evaporation section to the second plate and pushing the second plate to contact the second heat generating component; and wherein the elastic plate comprises a supporting arm and an elastic portion extending from an upper end of the supporting arm.

9. A heat dissipating apparatus for dissipating heat of two heat generating components simultaneously, the heat dissipating apparatus comprising:

a fan comprising a frame defining an air outlet, and an elastic plate extending outwards from the frame;

a heat sink coupled to the air outlet of the fan;

a heat pipe comprising a condensation section connected to the heat sink and an evaporation section for absorbing heat of the two heat generating components, the elastic plate abutting the evaporation section of the heat pipe at a position corresponding to one of the two heat generating components and applying a downward force thereto; and a base connected to the evaporation section of the heat pipe, the base being adapted for fixing the heat dissipating apparatus on a body on which the two heat generating components are mounted;

wherein the elastic plate comprises a supporting arm and an elastic portion extending from an upper end of the supporting arm.

10. The electronic device of claim 8, wherein the first plate is mounted to the circuit board on which the first heat generating component and the second heat generating component are mounted, while the second plate extends from the first plate without being mounted directly to the circuit board.

11. The heat electronic device of claim 8, wherein the elastic plate extends from a bottom plate of the frame.

12. The electronic device of claim 8, wherein the elastic portion comprises a through slot defined at a central portion thereof.

13. The heat dissipating apparatus of claim 9, wherein the elastic portion comprises two ribs, the two ribs each extending from a lateral side of the elastic portion.

14. The heat dissipating apparatus of claim 9, wherein the elastic portion comprises a plate extending towards a plane where the base sits.

15. The heat dissipating apparatus of claim 9, wherein the elastic portion comprises a through slot defined at a central portion thereof.

* * * * *